United States Patent
Shigematsu (10) Patent No.: US 6,472,941 B2
(45) Date of Patent: Oct. 29, 2002

(54) DISTRIBUTED AMPLIFIER WITH TERMINATING CIRCUIT CAPABLE OF IMPROVING GAIN FLATNESS AT LOW FREQUENCIES

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/826,365

(22) Filed: Apr. 5, 2001

(65) Prior Publication Data

US 2002/0008583 A1 Jan. 24, 2002

(30) Foreign Application Priority Data

Jul. 19, 2000 (JP) .......................................... 2000-218518

(51) Int. Cl.[7] ................................................. H03F 3/60
(52) U.S. Cl. ......................... 330/286; 330/295; 330/311
(58) Field of Search ................................. 330/286, 295, 330/311

(56) References Cited

U.S. PATENT DOCUMENTS 5,920,230 A * 7/1999 Beall ........................... 330/295
6,342,815 B1 * 1/2002 Kobayashi ................... 330/286

* cited by examiner

Primary Examiner—Michael B Shingleton
(74) Attorney, Agent, or Firm—Armstrong, Westerman, & Hattori, LLP.

(57) ABSTRACT

A plurality of amplifying circuits 31 to 34 are connected between input and output transmission circuits 10 and 20 in a forward direction, a bias-T 29 is connected to an output terminal OUT of the transmission circuit 20, and a DC bias voltage VDD1 is applied to the outputs of the amplifying circuits 31 to 34 through the inductor 292 of the circuit 29 and the transmission circuit 20. The opposite end to the output terminal OUT is grounded through a series connection of a terminating resistor R2 and a DC voltage source 30 having an output voltage VDD 2. Since VDD1=VDD1, the DC voltage across the terminating resistor R2 is zero. The inductor 292 may be connected in parallel to the terminating resistor R2 with omitting the bias voltage VDD1.

16 Claims, 7 Drawing Sheets

DISTRIBUTED AMPLIFIER WITH TERMINATING CIRCUIT CAPABLE OF IMPROVING GAIN FLATNESS AT LOW FREQUENCIES

BACKGROUND OF THE INVENTION

1. Field of the Invention

The present invention relates generally to a distributed amplifier, more particularly, to a distributed amplifier for use in amplifying a wideband signal of tens of kHz to 40 GHz or more.

2. Description of the Related Art

Along with a rapidly spread use of internet in recent years, demand has been increasing for a communication system which can transmit/receive a great volume of data at high speed, and as one constituent thereof, there have been requirements for amplifiers with a flat gain in the range of tens of kHz to 40 GHz or more.

A distributed amplifier has a LC transmission circuit (quasi-transmission line) of a high cut-off frequency due to coupling between the input/output capacitances of amplifying transistors and the distributed inductances of input/output transmission circuits. Therefore, the distributed amplifier is used for amplifying a wideband digital signal at stages before electronic to optical signal conversion and after optical to electronic signal conversion in communication system.

Figure 7:
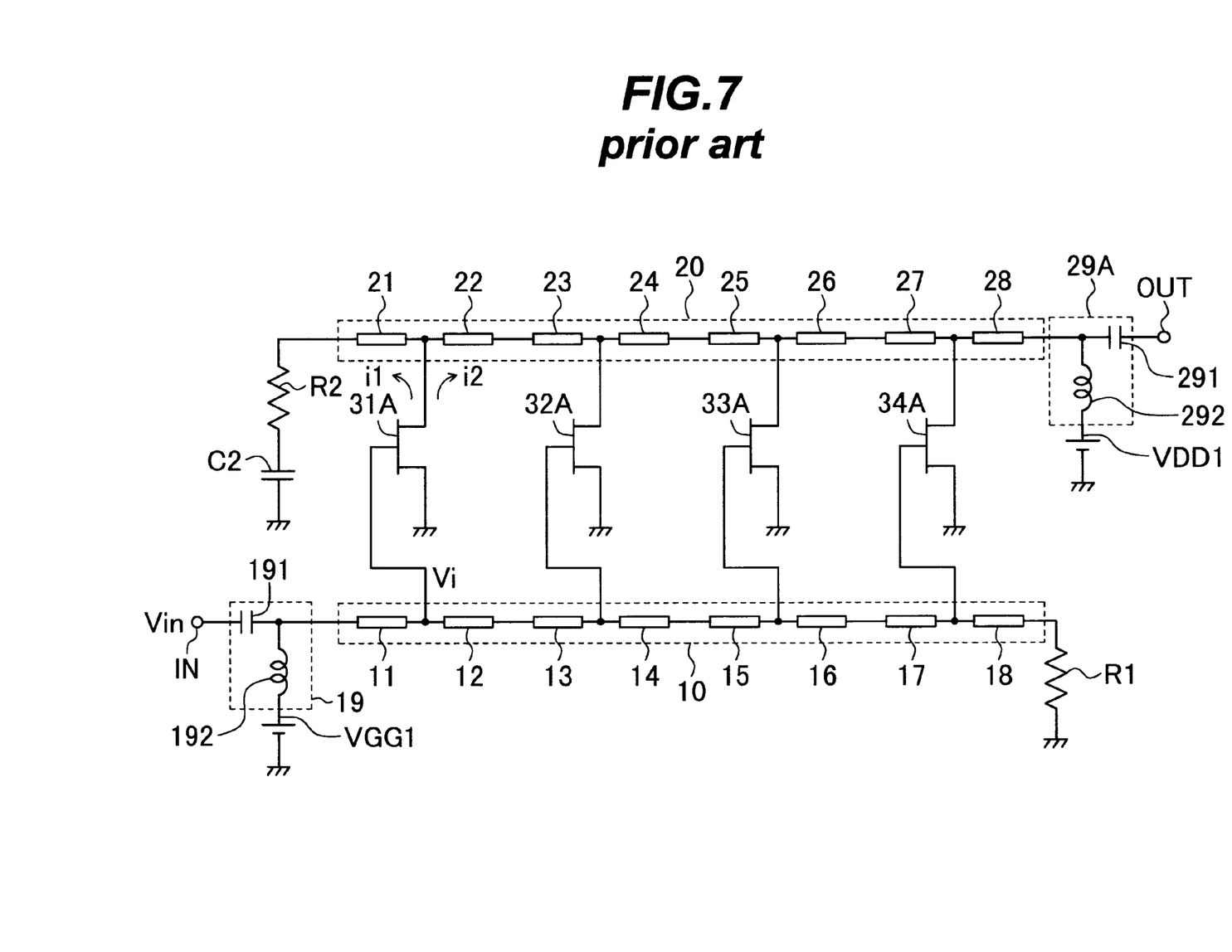
FIG. 7 is a circuit diagram showing a typical distributed amplifier in the prior art.

FIG. 7 shows a typical distributed amplifier in the prior art.

An output transmission circuit 20 has inductive elements 21 to 28 connected in series, and one end thereof is connected through a terminating circuit of a series connection of a terminating resistor R2 and a capacitor C2 to ground. The resistor R2 has an impedance of about 50 ohms which is nearly equal to a characteristic impedance of the output quasi-transmission line, and the capacitor C2 is employed to ground at high frequencies and block a dc current. By the capacitor C2, it is possible to prevent power from being consumed at the resistor R2 due to a drain bias voltage VDD1.

By applying a DC gate bias voltage VGG1 and a DC drain bias VDD1 to the gate and the drain, respectively, of each of FETs 31A to 34A, a DC bias current flows between the drain and the source of each of the FETs 31A to 34A.

When a voltage signal Vin is provided to the input terminal IN of the transmission circuit 10, the signal Vin propagates along the transmission circuit 10, and portions thereof shunt to the respective gates of FETs 31A to 34A. The FET 31A for example has a drain current composed of a signal component (i1+i2)) and a bias current component, where i1 and i2 are currents flowing out on the terminating resistor R2 side and the output terminal OUT side, respectively. Signal currents flowing to the output terminal OUT from the FETs 31A to 34A are simply accumulated at the output terminal OUT since signal path lengths from the input terminal IN through the respective FETs 31A to 34A to the output terminal OUT are the same as each other and in turn, the signal currents are all in phase at the output terminal OUT.

Since the impedance of the capacitor C2 can be neglected in regard to high frequency components of the signal, the impedances on the terminating resistor R2 side and the output terminal OUT side measured at the drain of FET 31A are approximately equal to a characteristic impedance 50 ohms, leading to the relation of i1=i2. This also applies to the cases of FETs 32A to 34A in a similar manner.

Figure 4:
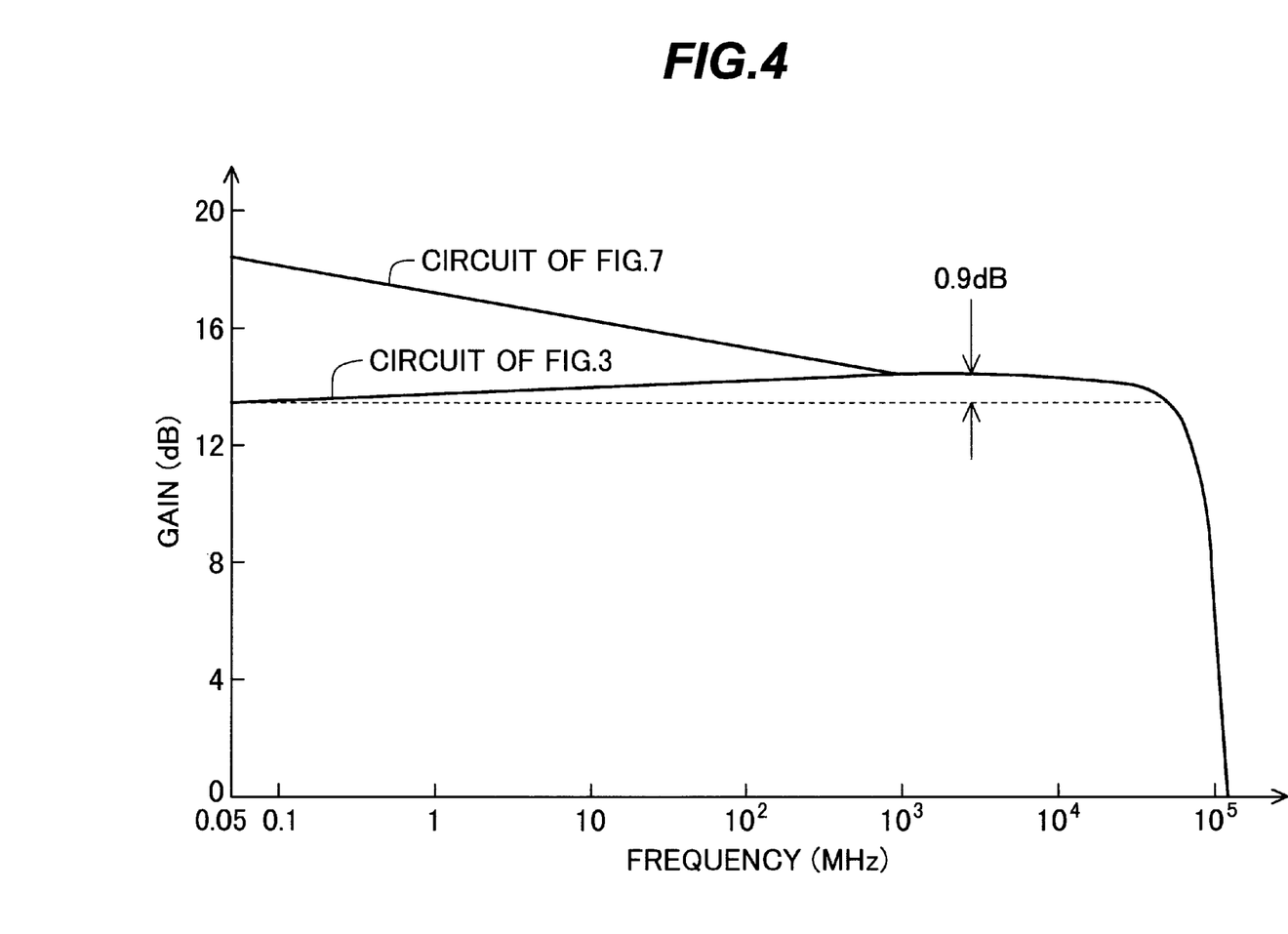
FIG. 4 is a graph showing frequency-gain characteristics of simulated results of the distributed amplifiers of FIGS. 3 and 7.

However, since the impedance of the capacitor C2 cannot be neglected in regard to low frequency components of the signal, the impedance on the terminating resistor R2 side increases for lower frequency components and the signal current i2 comes to be larger than the signal current i1. This also applies to the cases of FETs 32A to 34A in a similar manner. For this reason, as shown in FIG. 4, the gain of the distributed amplifier in the low frequency band is higher than that in the high frequency band where the gain stays flat, and tends to increase as a frequency is lower in the low frequency band.

If the capacitance C2 is omitted in order to prevent the increase in the gain in the low frequency band, a power consumed in the distributed amplifier is increased by the drain bias voltage VDD applied across the terminating resistor R2.

SUMMARY OF THE INVENTION

Accordingly, it is an object of the present invention to provide a distributed amplifier capable of improving the flatness of the gain at low frequencies and reducing power consumption with a simple configuration.

In one aspect of the present invention, there is provided a distributed amplifier with a terminating circuit connected to an end of an output transmission circuit which is, for example, an output transmission line, the terminating circuit comprising: a first DC bias voltage input terminal to apply a DC bias voltage through the output transmission circuit to outputs of a plurality of amplifying circuits; a terminating resistance connected between the first DC bias voltage input terminal and the end of the output transmission circuit; and a DC blocking circuit connected to the output transmission circuit to block a current across the terminating resistance.

With this configuration, since no DC blocking capacitor is connected in series to the terminating resistance, a higher gain at low frequencies is prevented to improve gain flatness. Further, since a current across the terminating resistance is prevented, a power consumption is reduced.

In one embodiment, the DC blocking circuit comprises: a second DC bias voltage input terminal to apply the DC bias voltage; and an inductor connected between the second DC bias voltage input terminal and the one end.

In another embodiment, the DC blocking circuit comprises an inductor connected in parallel to the terminating resistor.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
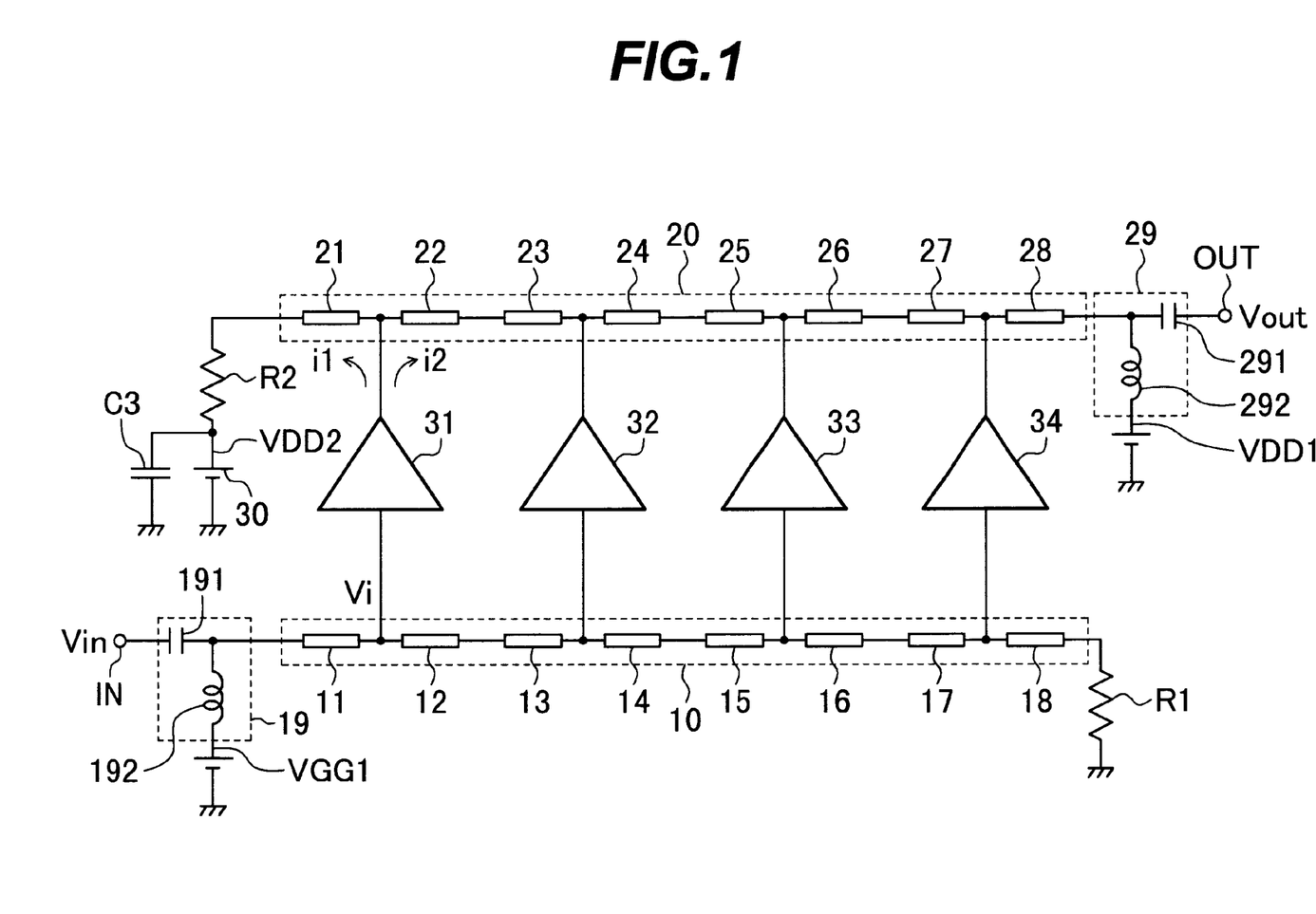
FIG. 1 is a circuit diagram showing a distributed amplifier of a first embodiment according to the present invention.

FIG. 1 shows a distributed amplifier of a first embodiment according to the present invention. This circuit is obtained by improving the circuit of FIG. 7 such that the gain is flatter at low frequencies and lower power consumption is realized. The circuit is, for example, a MMIC (Monolithic Microwave Integrated Circuit) fabricated on a compound semiconductor chip with the exception that bias-Ts 19 and 29 are external components and DC bias voltages VDD1 and VDD2 and a DC bias voltage VGG1 are generated outside the chip.

An input transmission circuit 10 is a series connection of inductive elements 11 to 18, and likewise an output transmission circuit 20 is a series connection of inductive elements 21 to 28. Each inductive element is a portion of a transmission line such as a micro-strip line or a co-planar line, or an individual inductor. Amplifying circuits 31 to 34 are connected in parallel between the input transmission circuit 10 and the output transmission circuit 20 in a forward direction. That is, the inputs and outputs of the amplifying circuits 31 to 34 are connected to the input transmission circuit 10 and the output transmission circuit 20, respectively. Coupling of the transmission circuit 10 with input capacitances of the amplifying circuits 31 to 34 forms an input LC transmission line (an input quasi-transmission line) with a characteristic impedance of typically approximately 50 ohms, and likewise coupling of the transmission circuit 20 with output capacitances of the amplifying circuits 31 to 34 forms an output LC transmission line (an output quisi-transmission line) with a characteristic impedance of typically approximately 50 ohms.

The signal input of the transmission circuit 10 is connected a bias-T 19 in which one ends of a capacitor 191 and an inductor 192 are connected. The other end of the capacitor 191 is connected to an input terminal IN to which an input voltage signal Vin is provided, and to the other end of the inductor 192, the DC bias voltage VGG1 to the inputs of the amplifying circuits 31 to 34 is applied. The other end of the transmission circuit 10 is grounded through the terminating resistor R1.

The signal output of the transmission circuit 20 is connected to a bias-T 29 in which one ends of a capacitor 291 and an inductor 292 are connected. The other end of the capacitor 291 is connected to an output terminal OUT, and to the other end of the inductor 292, a DC bias voltage VDD1 to the outputs of the amplifying circuits 31 to 34 is applied. The other end of the transmission circuit 20 is grounded through the series connection of a terminating resistor R2 and a DC voltage source 30. This DC voltage source 30 is employed to make the direct current flowing through the terminating resistor R2 to be almost zero so as to reduce the power consumption thereof, and the voltage VDD2 is substantially equal to the DC bias voltage VDD1. In FIG. 1, the internal resistance of the voltage source 30 is included in the terminating resistor R2. The impedance of the voltage source 30 for AC components is almost zero, and the impedance of the series connection of the terminating resistor R2 and the voltage source 30 is almost equal to that of the terminating resistor R2, typically approximately 50 ohms. A capacitor C3 is connected in parallel to the voltage source 30 in order to stabilize the output voltage of the voltage source 30, and does not affect the terminating impedance regardless of the value of its capacitance. Since the voltage source 30 is connected externally to the MMIC as described above, the capacitor C3 may also be connected externally thereto.

The terminating circuit has no DC blocking capacitor C2 of FIG. 7, whereby the gain of the distributed amplifier is prevented from increasing at low frequencies. Further, since the DC current flowing through the terminating resistor R2 is almost zero with the help of the voltage source 30, reduction in power consumption of the distributed amplifier is achieved.

Figure 2:
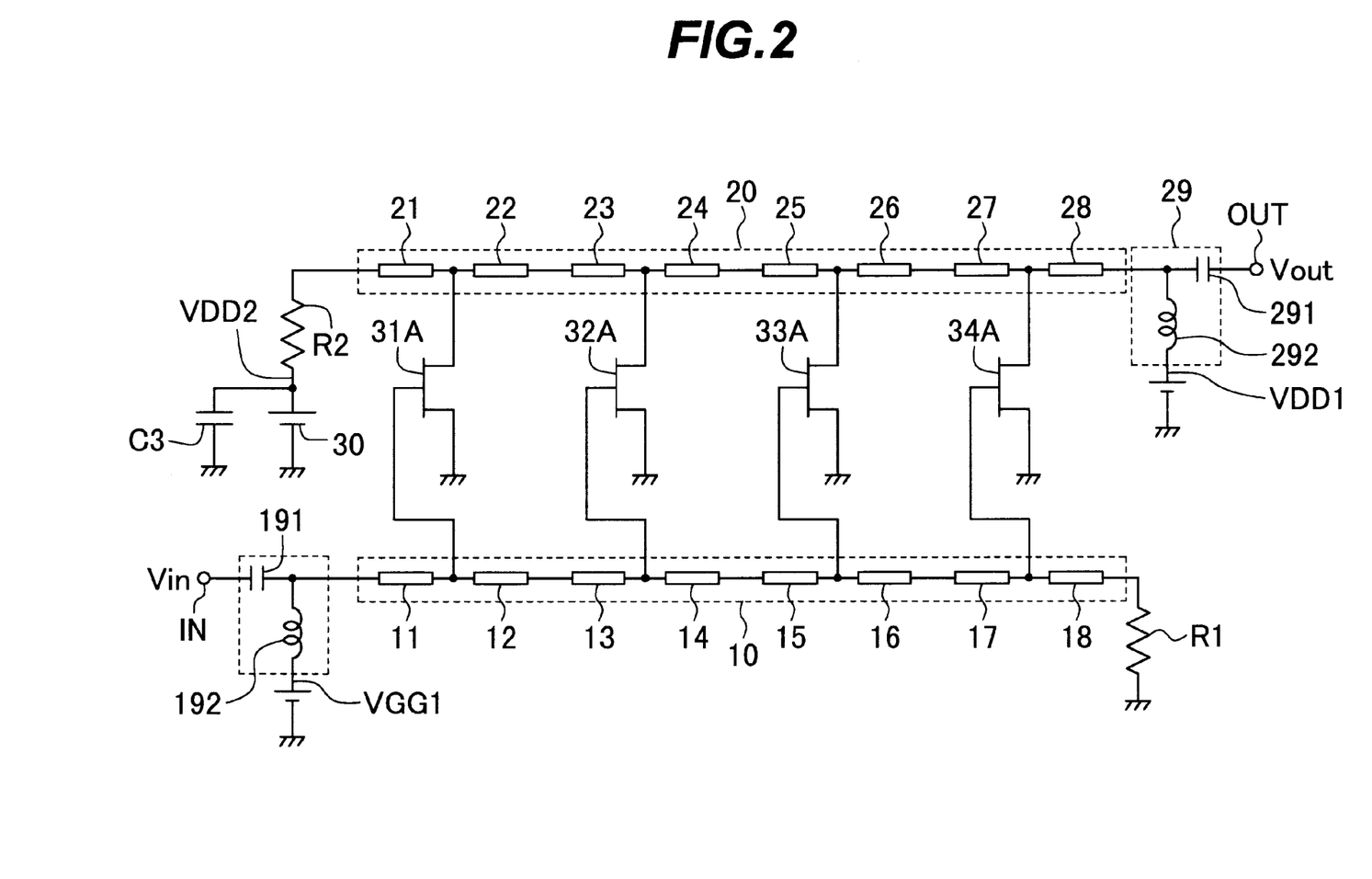
FIG. 2 is a circuit diagram showing a more concrete embodiment of the distributed amplifier of FIG. 1.

FIG. 2 is a circuit diagram showing a more concrete embodiment of the distributed amplifier of FIG. 1, wherein the amplifying circuits 31 to 34 of FIG. 1 are constituted of FETs 31A to 34A, respectively. Each FET is, for example, a MES structure and made at the top surface of a GaAs substrate.

In the amplifying circuit consists of FET 31A, the input and the output thereof are the gate and the drain, respectively, of the FET 31A, and the source thereof is grounded. This also applies to the FET 32A to 34A in a similar manner.

Figure 3:
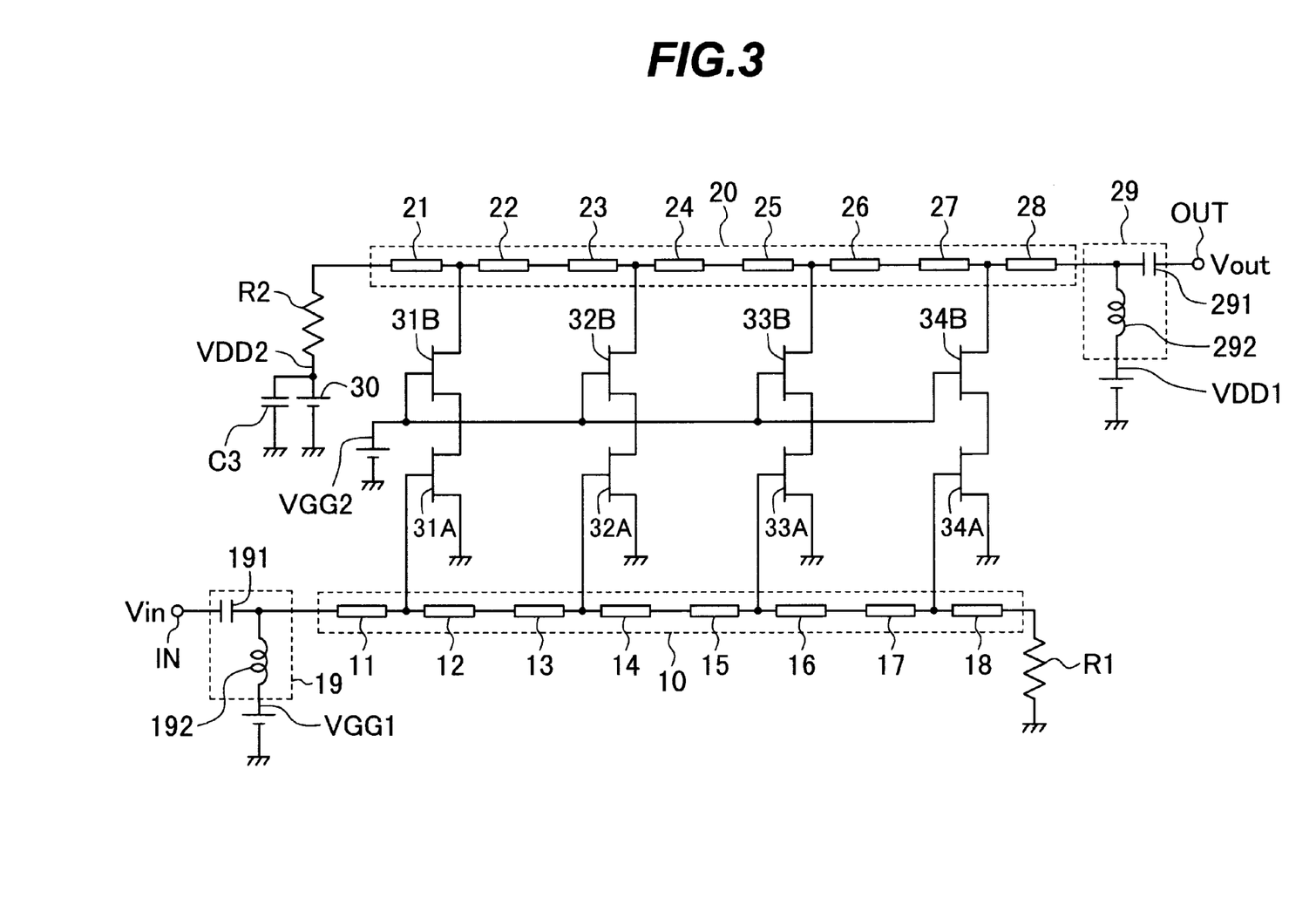
FIG. 3 is a circuit diagram showing another concrete embodiment of the distributed amplifier of FIG. 1.

FIG. 3 is a circuit diagram showing another more concrete embodiment of the distributed amplifier of FIG. 1.

In this circuit, the amplifying circuit 31 of FIG. 1 is constructed of the cascode connection of the FETs 31A and 31B. That is, the current path of FET 31B is connected between the drain of the FET 31A of FIG. 2 and the transmission circuit 20, and a DC bias voltage VGG2 is applied to the gate of the FET 31B. This applies to the other amplifying circuits connected between the transmission circuits 20 and 10 in a similar way to the above case.

According to the circuit of FIG. 3, a lower power consumption and a higher gain than the circuit of FIG. 2 are achieved owing to the cascode connection as known in the art. Further, since more of the Miller capacitance can be reduced than in the circuit of FIG. 2 owing to the cascode connection as known in the art, a wider band distributed amplifier can be realized.

FIG. 4 shows frequency-gain characteristics from simulated results of the distributed amplifiers of FIGS. 3 and 7.

It was assumed as conditions of each simulation that FETs are of HEMTs (High Electron Mobility Transistors) fabricated at the top surfaces of an InP substrate in order to assure a wider frequency band of a distributed amplifier, that R1=R2=50 ohms, VDD1=VDD2=3.2 V and VGG1=VGG2=1.6 V, and that the capacitor C2 of FIG. 7 has 50 pF and the capacitor C3 of FIG. 3 is omitted because the voltage VDD2 is stable in simulation.

In the circuit of FIG. 7, as a frequency is lowered from 1 GHz, the gain increases, whereby the flatness of the gain is poor.

The variation of the gain is required to be 1 dB or less for a good flatness in an operational frequency range, and the gain variation of the circuit of FIG. 3 is 0.9 dB over a wide band from 50 kHz to 80 GHz, which meets the requirement. In order to confine the gain variation within 1 dB or less using the circuit of FIG. 7, the capacitor C2 has to be of 1 $\mu$F or more, and therefor the occupied area thereof on the substrate is very wide, which makes the degree of integration on a semiconductor chip to be low. In the circuit of FIG. 3, since such a wide capacitor C2 is unnecessary, a semiconductor chip area can be narrowed or the number of components of an amplifier can be reduced.

In the circuit of FIG. 3, the gain is low at low frequencies. This is because the inductance value of the inductor 292 decreases as the frequency becomes lower, and the branching ratio of AC current components to the inductor 292 side increase as the frequency becomes lower.

Second Embodiment

Figure 5:
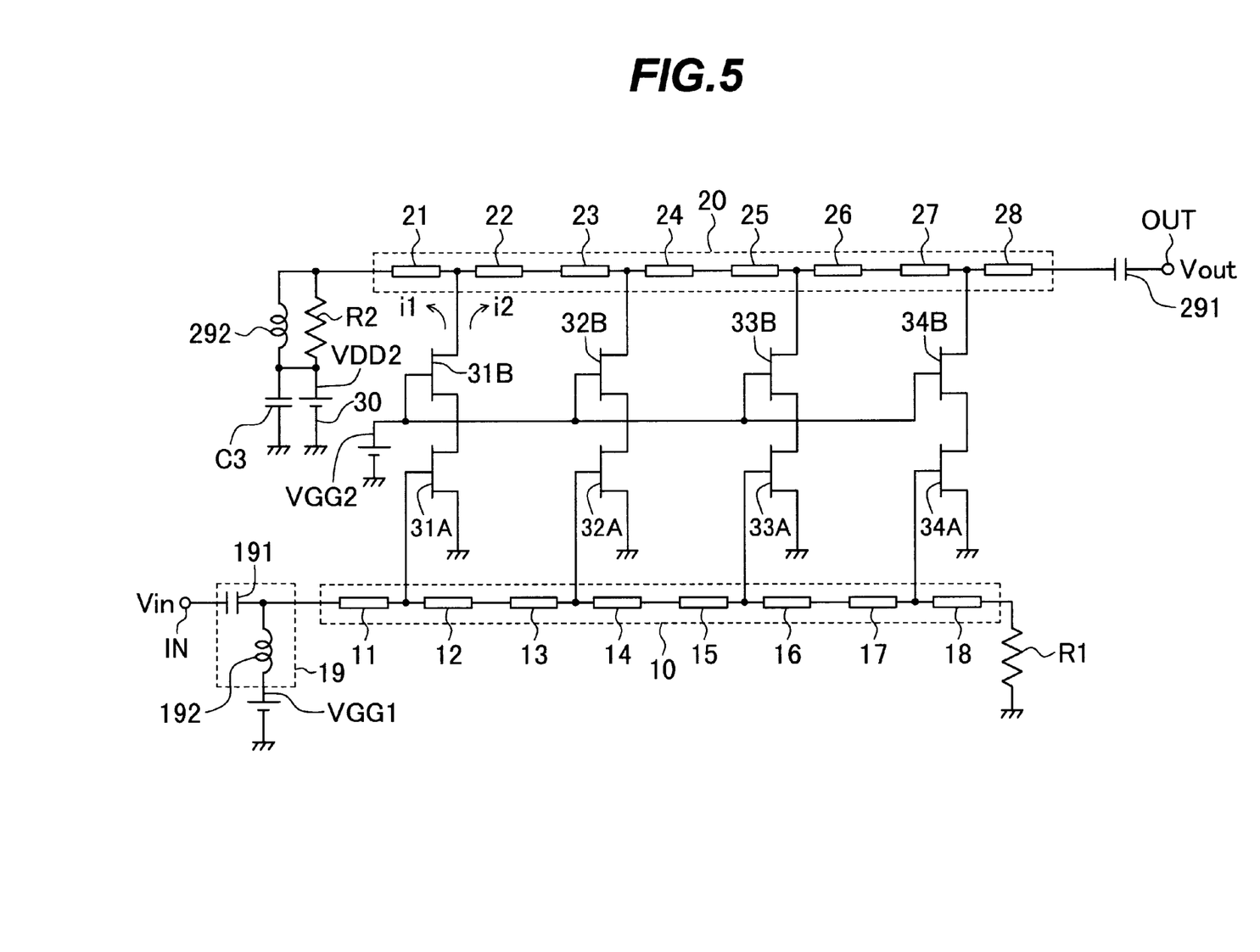
FIG. 5 is a circuit diagram showing a distributed amplifier of a second embodiment according to the present invention.

FIG. 5 is a circuit diagram showing a distributed amplifier of a second embodiment according to the present invention.

In this distributed amplifier, the inductor 292 of FIG. 3 is not connected to the output terminal OUT side but to the terminating resistor R2 in parallel.

The DC bias voltage VDD2 is applied through the inductor 292 to the drains of FETs 31B to 34B. The AC components propagating from the drains of FETs 31B to 34B through the transmission circuit 20 to the terminating circuit mainly flow through the terminating resistor R2 and the voltage source 30 to ground. Since the impedance of the inductor 292 is relatively low at low frequencies, the relation i1>i2 holds, and the gain of the distributed circuit is lower at low frequencies than at high frequencies in a similar way to the case of FIG. 3.

Note that the circuit of FIG. 3 is superior to the circuit of FIG. 5 in that the inductor 292 of FIG. 3 is able to have a smaller inductance value enough to be formed on chip than that of FIG. 5.

Third Embodiment

Figure 6:
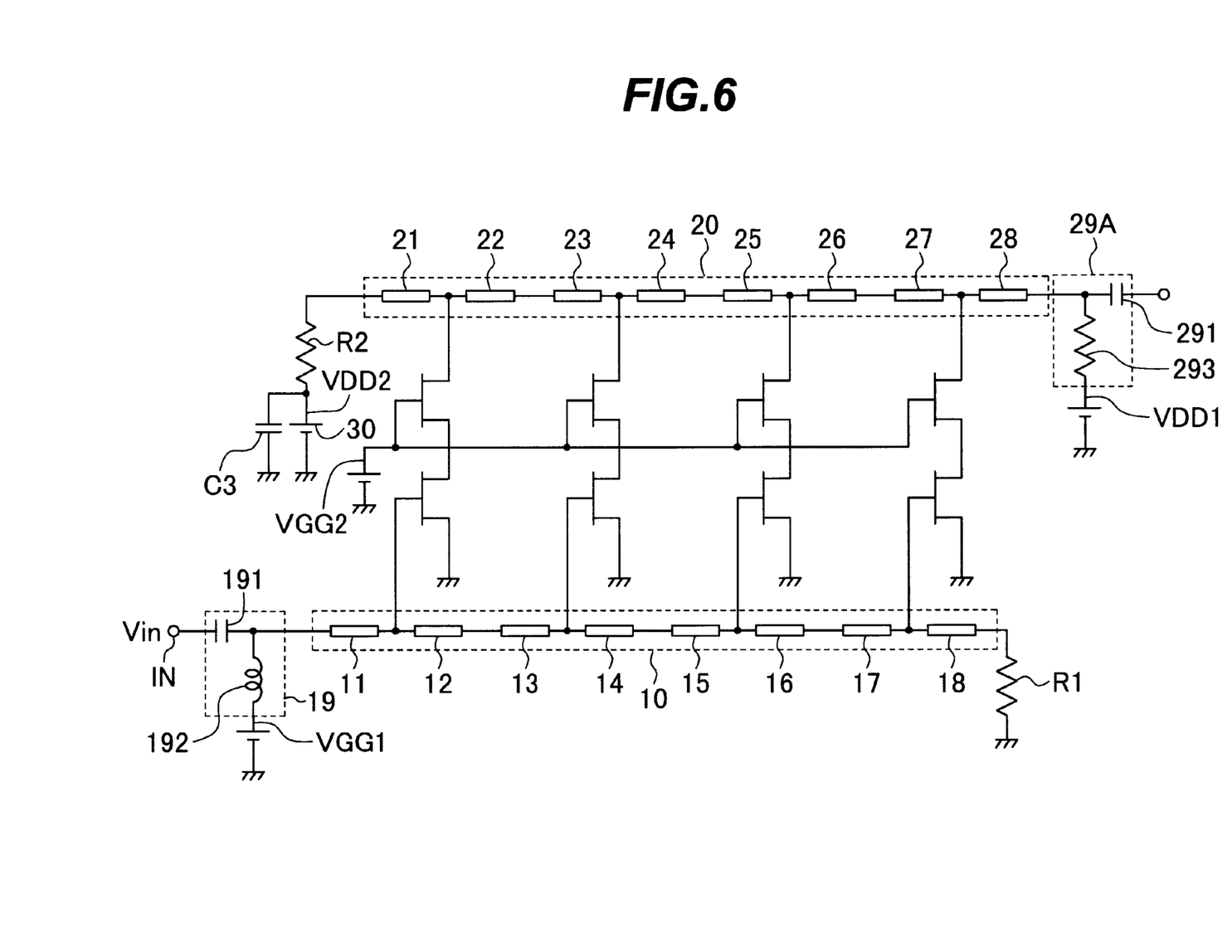
FIG. 6 is a circuit diagram showing a distributed amplifier of a third embodiment according to the present invention.

FIG. 6 is a circuit diagram showing a distributed amplifier of a third embodiment according to the present invention.

In this distributed amplifier, a bias-T 29A comprises a resistor 293 instead of the inductor 292 of FIG. 3.

The resistor 293 has a resistance value of at least 4 times, preferably 6 times, as large as an characteristic impedance, typically approximately 50 ohms, of the output quisi-transmission line in order to suppress reduction in gain of the amplifier by blocking AC current components to shunt to the resistor 293 side.

According to the distributed amplifier of the third embodiment, since the impedance of the resistor 293 is about constant independently of a frequency, the gain becomes flatter than in the case of the circuit of FIG. 3. Further, the number of components of the amplifier can be reduced by forming the resistor 293 within the MMIC device because the size of the resistor 293 can be smaller than that of the inductor 292 of FIG. 3.

Although preferred embodiments of the present invention has been described, it is to be understood that the invention is not limited thereto and that various changes and modifications may be made without departing from the spirit and scope of the invention.

For example, the number of amplifier circuits connected between the input and output transmission circuits may be at least 2.

Further, the type of an amplifying transistor may be selected according to an operating frequency range, and not limited to a MES (Metal Semiconductor) structure, but may be a MIS (Metal Insulator Semiconductor) structure or a bipolar type such as an HBT (Hetero Bipolar Transistor).

What is claimed is:

1. A distributed amplifier comprising:
   an input transmission circuit;
   an output transmission circuit having one end to output an amplified signal and the other end;
   a plurality of amplifying circuits connected between said input and output transmission circuits;
   a terminating circuit connected to said other end, said terminating circuit comprising:
      a first DC bias voltage input terminal; a terminating resistance connected between said first DC bias voltage input terminal and said other end;
      an AC blocking element, having first and second ends, said first end being connected to said output transmission circuit; and
      a second DC bias voltage input terminal, for applying to outputs of said plurality of amplifying circuits, connected to said second end of said AC blocking element,
   wherein the first DC bias voltage is determined such that a DC current flowing through said terminating resistance is prevented,
   whereby a DC cut capacitor is omitted from said terminating circuit.

2. The distributed amplifier of claim 1, wherein said AC blocking element is an inductor.

3. The distributed amplifier of claim 1, wherein said AC blocking element is a resistor having a resistance value of at least three times as large as a characteristic impedance of said output transmission circuit indicator.

4. A distributed amplifier comprising:
   an input transmission circuit;
   an output transmission circuit having one end to output an amplified signal and the other end;
   a plurality of amplifying circuits connected between said input and output transmission circuits;
   a terminating circuit connected to said other end, said terminating circuit comprising:
      a DC bias voltage input terminal to apply a DC bias voltage to outputs of said plurality of amplifying circuits; a terminating resistance connected between said DC bias voltage input terminal and said other end; and
      an inductor connected in parallel to said terminating resistor,
   whereby a DC cut capacitor is omitted from said terminating circuit.

5. The distributed amplifier of claim 1, wherein each of said plurality of amplifying circuits comprises a first transistor having a control input and a current path between first and second ends, said control input being coupled to said input transmission circuit, said first end of said current path being coupled to said output transmission circuit, said second end of said current path being coupled to a common potential.

6. The distributed amplifier of claim 5, wherein each of said amplifying circuits further comprises a second transistor cascode-connected between said first end of said current path of said first transistor and said output transmission circuit.

7. The distributed amplifier of claim 5, wherein said first transistor is an FET.

8. The distributed amplifier of claim 2, wherein each of said plurality of amplifying circuits comprises a first transistor having a control input and a current path between first and second ends, said control input being coupled to said input transmission circuit, said first end of said current path being coupled to said output transmission circuit, said second end of said current path being coupled to a common potential.

9. The distributed amplifier of claim 8, wherein each of said amplifying circuits further comprises a second transistor cascode-connected between said first end of said current path of said first transistor and said output transmission circuit.

10. The distributed amplifier of claim 8, wherein said first transistor is an FET.

11. The distributed amplifier of claim 3, wherein each of said plurality of amplifying circuits comprises a first transistor having a control input and a current path between first and second ends, said control input being coupled to said input transmission circuit, said first end of said current path being coupled to said output transmission circuit, said second end of said current path being coupled to a common potential.

12. The distributed amplifier of claim 11, wherein each of said amplifying circuits further comprises a second transistor cascode-connected between said first end of said current path of said first transistor and said output transmission circuit.

13. The distributed amplifier of claim 11, wherein said first transistor is an FET.

14. The distributed amplifier of claim 4, wherein each of said plurality of amplifying circuits comprises a first transistor having a control input and a current path between first and second ends, said control input being coupled to said input transmission circuit, said first end of said current path being coupled to said output transmission circuit, said second end of said current path being coupled to a common potential.

15. The distributed amplifier of claim 14, wherein each of said amplifying circuits further comprises a second transistor cascode-connected between said first end of said current path of said first transistor and said output transmission circuit.

16. The distributed amplifier of claim 14, wherein said first transistor is an FET.

* * * * *